(12) United States Patent
Utz et al.

(10) Patent No.: US 12,477,686 B2
(45) Date of Patent: Nov. 18, 2025

(54) LIQUID COOLING BENCH CLIP

(71) Applicant: Dell Products L.P., Round Rock, TX (US)

(72) Inventors: James Utz, Georgetown, TX (US); Corey Dean Hartman, Hutto, TX (US); Ben John Sy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 74 days.

(21) Appl. No.: 18/428,687

(22) Filed: Jan. 31, 2024

(65) Prior Publication Data

US 2025/0248000 A1 Jul. 31, 2025

(51) Int. Cl.
*H05K 7/20* (2006.01)
*F16B 2/18* (2006.01)

(52) U.S. Cl.
CPC ..... *H05K 7/20272* (2013.01); *H05K 7/20781* (2013.01); *F16B 2/185* (2013.01)

(58) Field of Classification Search
CPC .. H05K 7/20272; H05K 7/20781; F16B 2/20; F16B 2/18
USPC .................... 165/80.4; 361/679.53
See application file for complete search history.

(56) References Cited

U.S. PATENT DOCUMENTS

| | | | |
|---|---|---|---|
| D687,778 S * | 8/2013 | Utz | D13/133 |
| 8,922,998 B2 * | 12/2014 | Campbell | H05K 7/2079 361/689 |
| 10,164,373 B1 * | 12/2018 | Cheon | H05K 7/20781 |
| 10,309,864 B1 * | 6/2019 | Lee | G05D 7/0623 |
| 10,701,838 B1 * | 6/2020 | Conroy | H05K 7/20781 |
| 10,881,030 B1 * | 12/2020 | Lunsman | H05K 7/1487 |
| 10,921,070 B2 * | 2/2021 | Chen | H05K 7/20272 |
| 11,363,738 B2 * | 6/2022 | Thompson | H05K 7/20272 |
| 11,452,237 B2 * | 9/2022 | Tan | H05K 7/20272 |
| 11,898,674 B2 * | 2/2024 | Yang | H05K 7/20781 |
| 11,980,007 B2 * | 5/2024 | Gao | H05K 7/20272 |
| 12,031,780 B2 * | 7/2024 | Stammer | F28F 9/0256 |
| 12,178,013 B2 * | 12/2024 | DeMars | H05K 5/0204 |
| 12,200,913 B2 * | 1/2025 | Heydari | H05K 7/20272 |
| 12,235,056 B1 * | 2/2025 | An | F28F 9/0258 |
| 12,338,926 B1 * | 6/2025 | Lin | F16L 27/026 |
| 12,356,587 B2 * | 7/2025 | Ting | H05K 7/20272 |
| 2007/0274043 A1 * | 11/2007 | Shabany | H05K 7/20781 361/696 |
| 2008/0092387 A1 * | 4/2008 | Campbell | H05K 7/20772 29/890.035 |

(Continued)

*Primary Examiner* — Claire E Rojohn, III
(74) *Attorney, Agent, or Firm* — Fogarty LLP

(57) ABSTRACT

A bench clip for a liquid cooling system is disclosed. The bench clip comprises a manifold attached to a liquid coolant fitting. A retention bracket has a first slot that is adapted to receive a tab on the manifold. The retention bracket has a second slot oriented perpendicular to the first slot. A handle is pivotably mounted to a post on the manifold. The handle has a post positioned within the second slot on the retention bracket. The manifold tab is configured to slide within the first slot and the handle post is configured to slide within the second slot in response to movement of the handle. Movement of the manifold tab within the first slot limits the movement of the manifold to a single axis relative to the clip. An attachment end of the retention bracket is configured to engage with a portion of a server chassis.

20 Claims, 9 Drawing Sheets

(56) References Cited

U.S. PATENT DOCUMENTS

| | | | | |
|---|---|---|---|---|
| 2010/0002393 A1* | 1/2010 | Campbell | H05K 7/20772 |
| | | | 361/699 |
| 2011/0313576 A1* | 12/2011 | Nicewonger | H05K 7/20781 |
| | | | 361/701 |
| 2012/0128308 A1* | 5/2012 | Case | G02B 6/44715 |
| | | | 385/135 |
| 2013/0215581 A1* | 8/2013 | Utz | H05K 3/325 |
| | | | 361/752 |
| 2013/0312846 A1* | 11/2013 | Eriksen | H05K 7/20772 |
| | | | 137/315.01 |
| 2013/0312854 A1* | 11/2013 | Eriksen | F16L 37/32 |
| | | | 137/544 |
| 2014/0202678 A1* | 7/2014 | Goth | H05K 7/20763 |
| | | | 165/200 |
| 2014/0240920 A1* | 8/2014 | Cox | H05K 7/20781 |
| | | | 361/679.53 |
| 2016/0113149 A1* | 4/2016 | Krug, Jr. | H05K 7/20781 |
| | | | 165/173 |
| 2017/0229814 A1* | 8/2017 | Jimenez, III | H01R 13/6272 |
| 2017/0257980 A1* | 9/2017 | Fukunaga | F16L 37/40 |
| 2020/0260608 A1* | 8/2020 | Thibaut | H05K 7/1489 |
| 2022/0338374 A1* | 10/2022 | Heydari | H05K 7/20281 |
| 2023/0056298 A1* | 2/2023 | Gao | H05K 7/20772 |
| 2023/0227113 A1* | 7/2023 | McKinley | B62D 63/025 |
| | | | 296/190.01 |
| 2024/0032241 A1* | 1/2024 | Coxe, III | H05K 7/20272 |
| 2024/0138123 A1* | 4/2024 | Duncan | H05K 7/20272 |
| 2025/0118826 A1* | 4/2025 | Brennan | H01M 10/6557 |
| 2025/0176129 A1* | 5/2025 | Utz | G06F 1/1679 |
| 2025/0231598 A1* | 7/2025 | Bassman | G06F 1/188 |
| 2025/0234473 A1* | 7/2025 | Bassman | H05K 7/1407 |

* cited by examiner

LIQUID COOLING BENCH CLIP

BACKGROUND

An Information Handling System (IHS) generally processes, compiles, stores, and/or communicates information or data for business, personal, or other purposes. IHSs may include a variety of hardware and software components that are configured to process, store, and communicate information and may include one or more computer systems, data storage systems, and networking systems. As IHS hardware components, such as processors and memory, have increased in speed and power consumption, the amount of heat produced by such components during operation of an IHS has also increased. Often, the temperatures of IHS hardware components must be kept within a well-defined range in order to prevent overheating, instability, malfunction, and/or damage that would lead to a shortened component lifespan and lowered datacenter reliability. Accordingly, cooling systems are used in IHSs in order to remove heat that is generated by hardware components. In passive airflow cooling systems, cooling fans are used to force heated air away from a hardware component, and to ventilate heated air away from cooling fins or other heat dissipating structures of the component. In an active, liquid cooling system, a heat-exchanging cold plate is thermally coupled to an IHS component that is to be cooled, and a chilled fluid is passed through conduits internal to the cold plate in order to remove heat from that component. The heated liquid is then cooled and recirculated.

SUMMARY

Embodiments are directed to a bench clip for a liquid cooling system. The bench clip comprises a manifold that is attached to a liquid coolant fitting. The manifold has a port for attachment to a liquid coolant line. A retention bracket on the clip has a first slot that is adapted to receive a tab on the manifold. The retention bracket has a second slot oriented perpendicular to the first slot. A handle is pivotably mounted to a post on the manifold. The handle has a post positioned within the second slot on the retention bracket. An attachment end of the retention bracket is configured to engage with a portion of a server chassis. The manifold tab is configured to slide within the first slot and the handle post is configured to slide within the second slot in response to movement of the handle. The first slot is oriented horizontally, and the second slot is oriented vertically. Movement of the manifold tab within the first slot limits the movement of the manifold to a single axis relative to the clip.

Movement of the handle post downward in the second slot causes the manifold tab to move in a forward direction in the first slot, and movement of the handle post upward in the second slot causes the manifold tab to move in a backward direction in the first slot. The rotation of the handle to a horizontal position forces the liquid coolant fitting toward the attachment end of the retention bracket, and rotation of the handle to a vertical position forces the liquid coolant fitting away from the attachment end of the retention bracket.

In some embodiments, the attachment end of the retention bracket is configured to engage a liquid coolant fitting or a fastener portion of a liquid coolant fitting on the server chassis. In other embodiments, the attachment end of the retention bracket is configured to engage a slot, hole, detent, or protrusion or other feature on the server chassis.

The liquid coolant fitting attached to the manifold is adapted to engage a liquid coolant fitting on the server chassis so that cooling fluid can pass to or from the liquid coolant line. When the attachment end is engaged with a feature of the server chassis, the clip remains in position relative to the server chassis in response to forces generated by coolant fitting connections or by liquid coolant hydraulic forces.

BRIEF DESCRIPTION OF THE DRAWINGS

Figure 1:
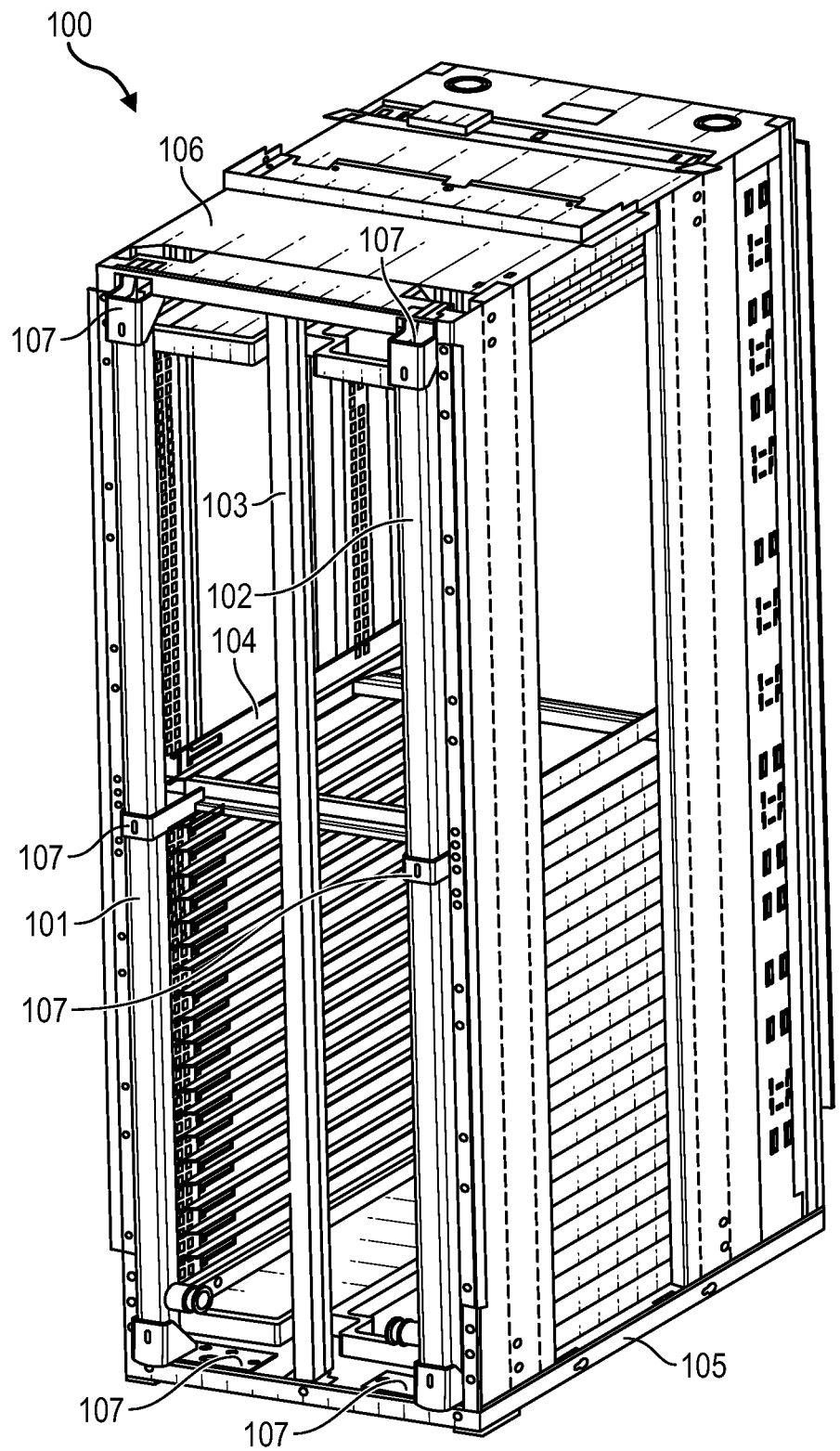

Having thus described the invention in general terms, reference will now be made to the accompanying drawings, which are not necessarily drawn to scale, and wherein:

FIG. 1 shows a computing rack that includes liquid cooling manifolds and a busbar according to embodiments.

Figure 2:
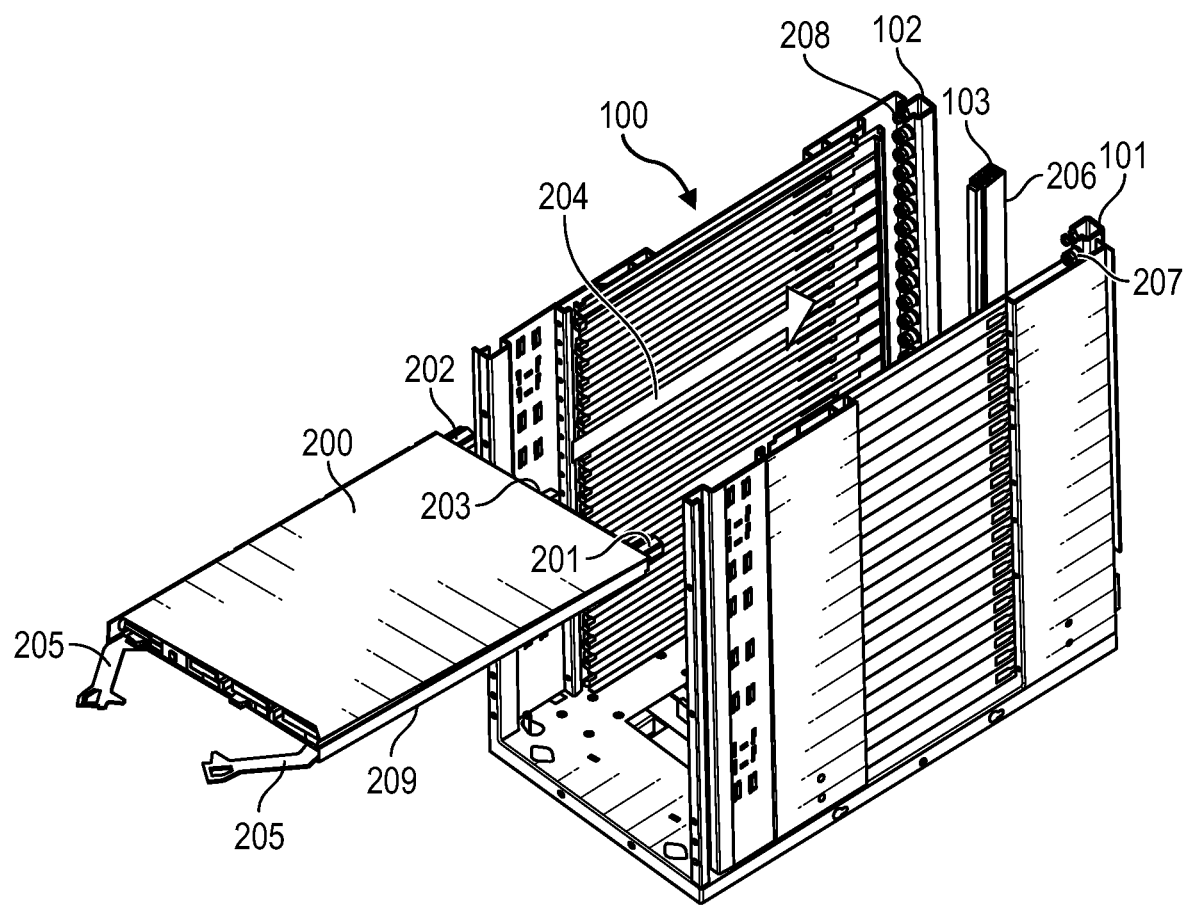

FIG. 2 is a front-view illustration of a server IHS being inserted into a slot of the computing rack shown in FIG. 1.

Figure 3:
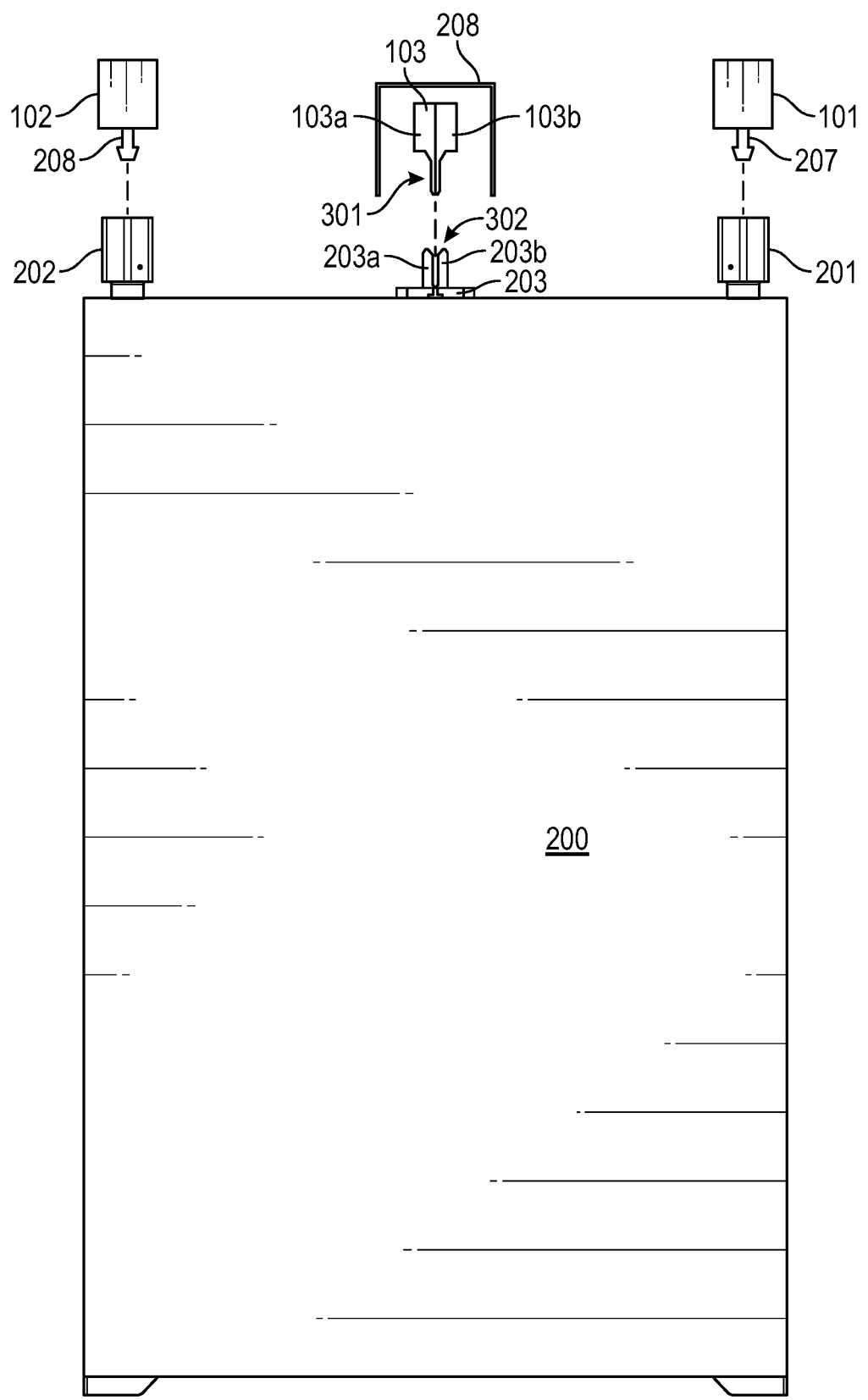

FIG. 3 is a top view of a server IHS 200 making power and cooling connections while being installed into the computing rack shown in FIG. 1.

Figure 4:
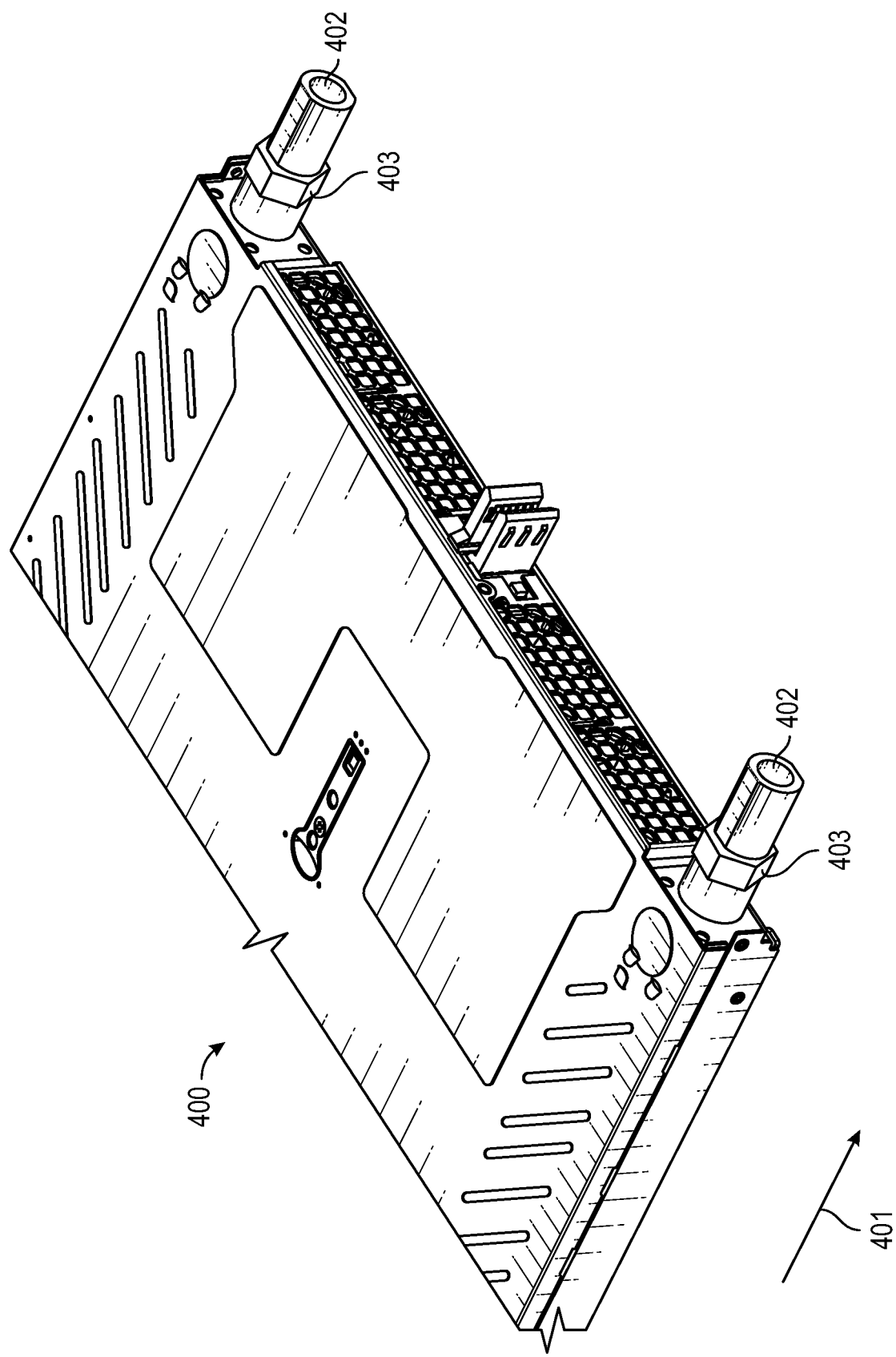

FIG. 4 is a partial top view from the rear of a server chassis that is adapted to fit in a computing rack.

Figure 5:
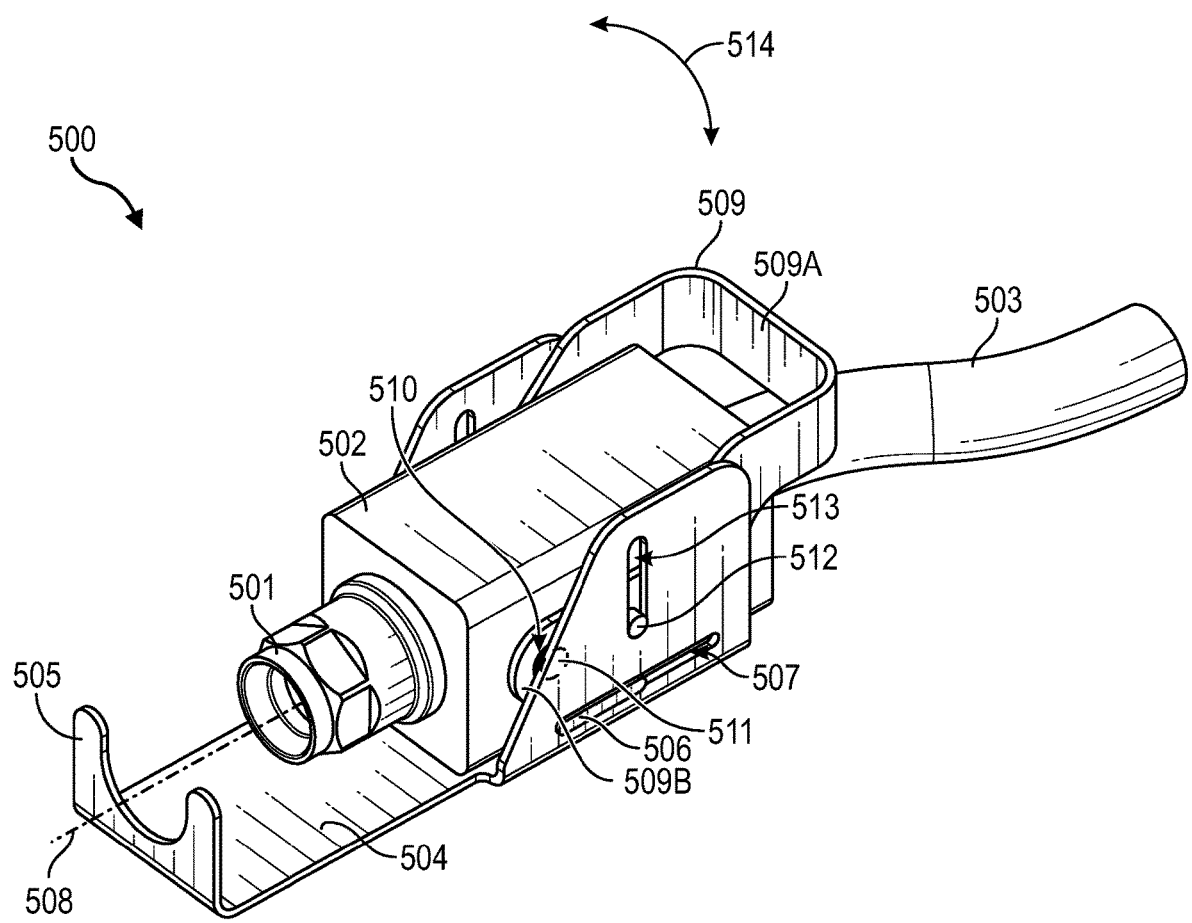

FIG. 5 illustrates a liquid cooling bench clip according to an example embodiment.

Figure 6A:
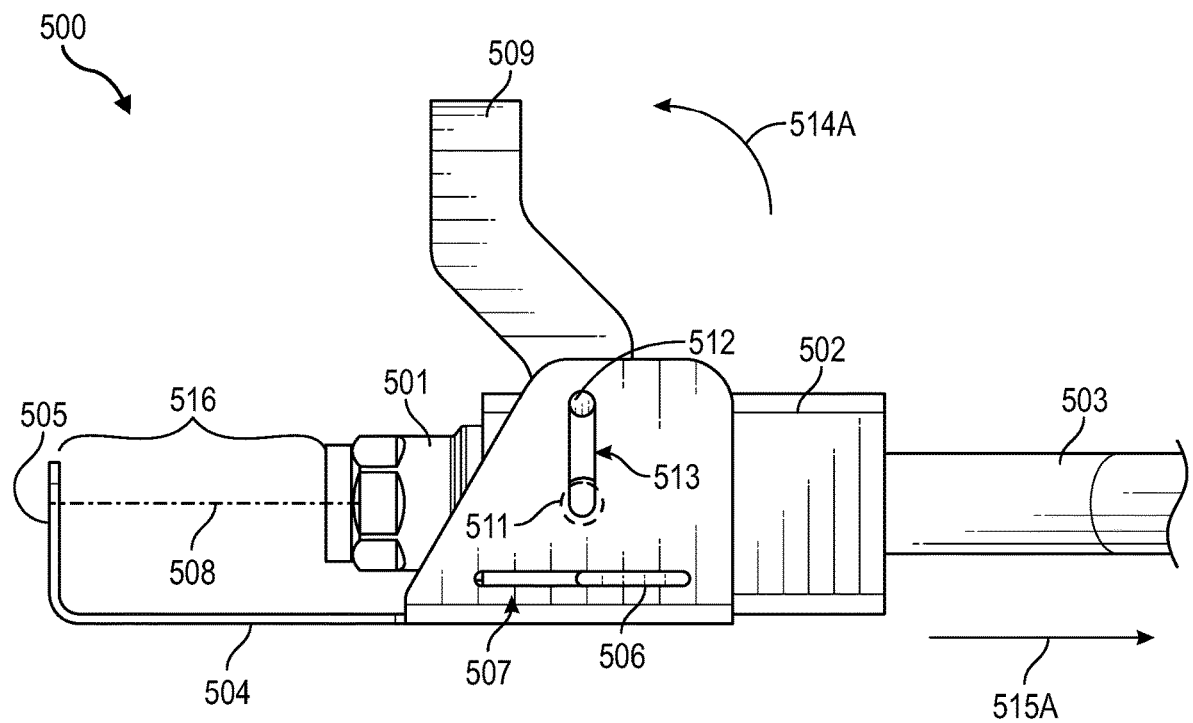
Figure 6B:
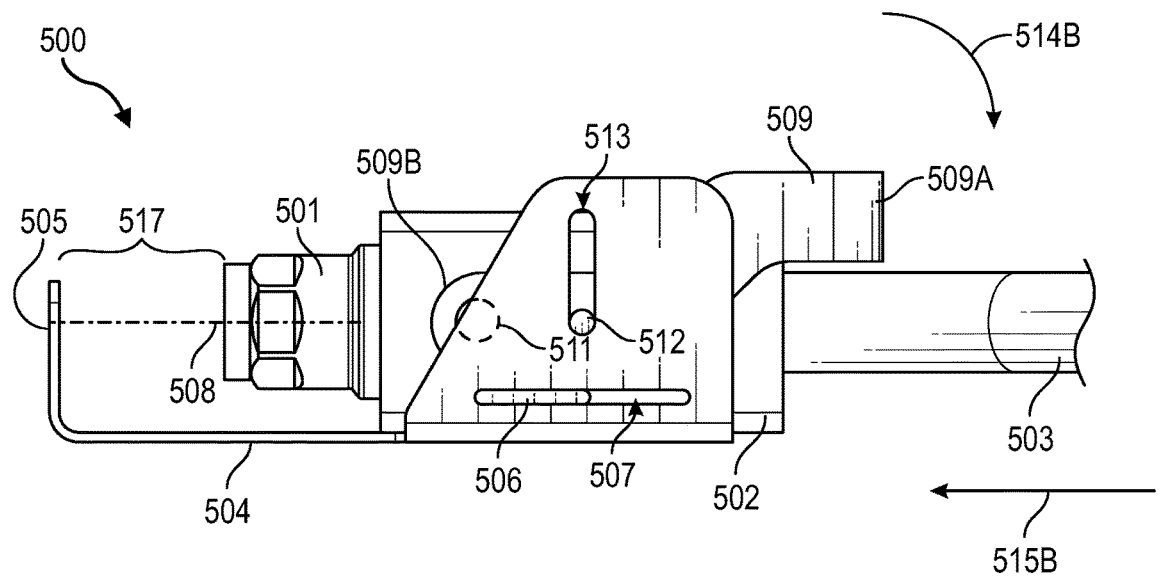

FIGS. 6A and 6B illustrate operation of the bench clip when the handle is moved between the vertical position and the horizontal position.

Figure 7A:
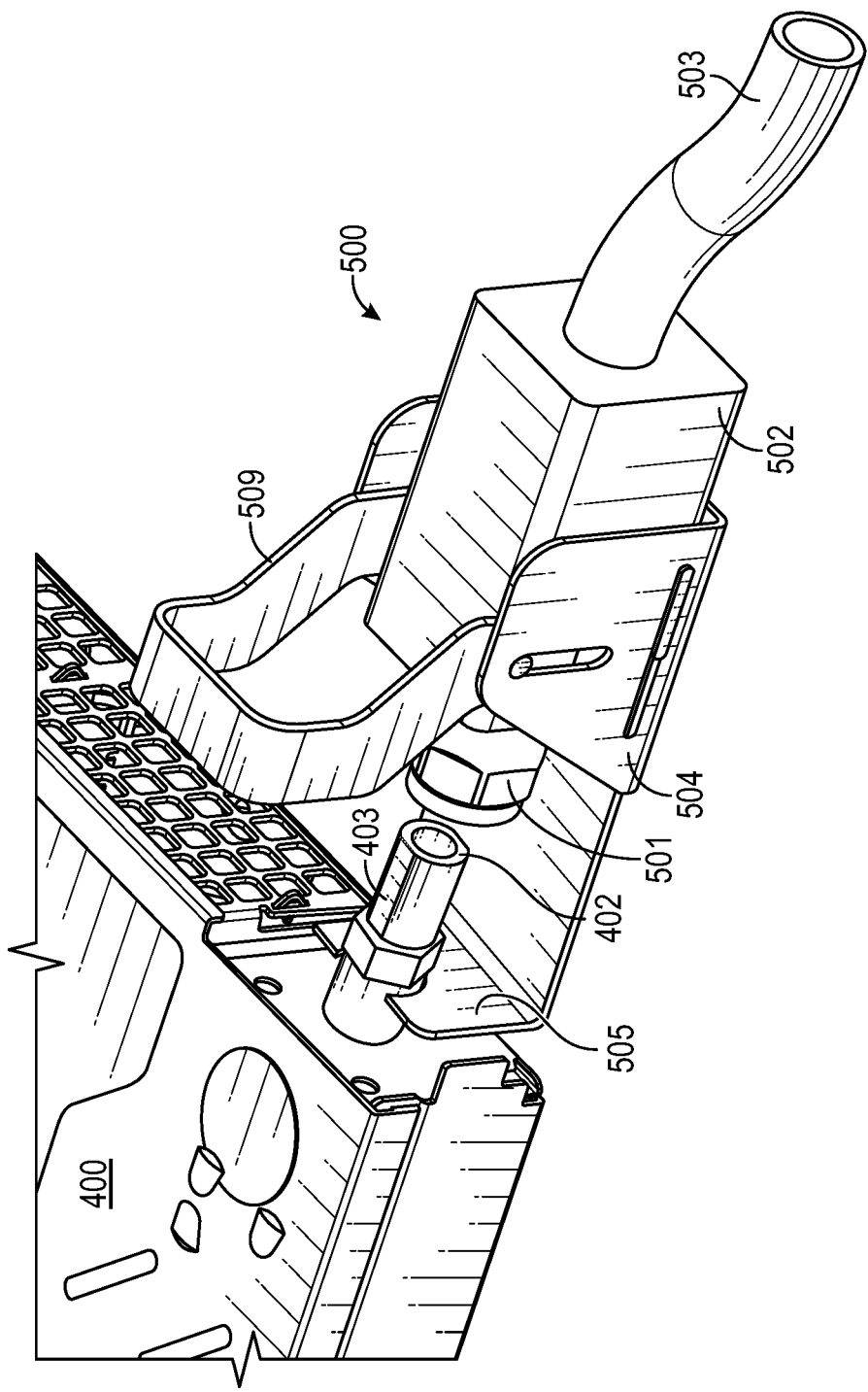
Figure 7B:
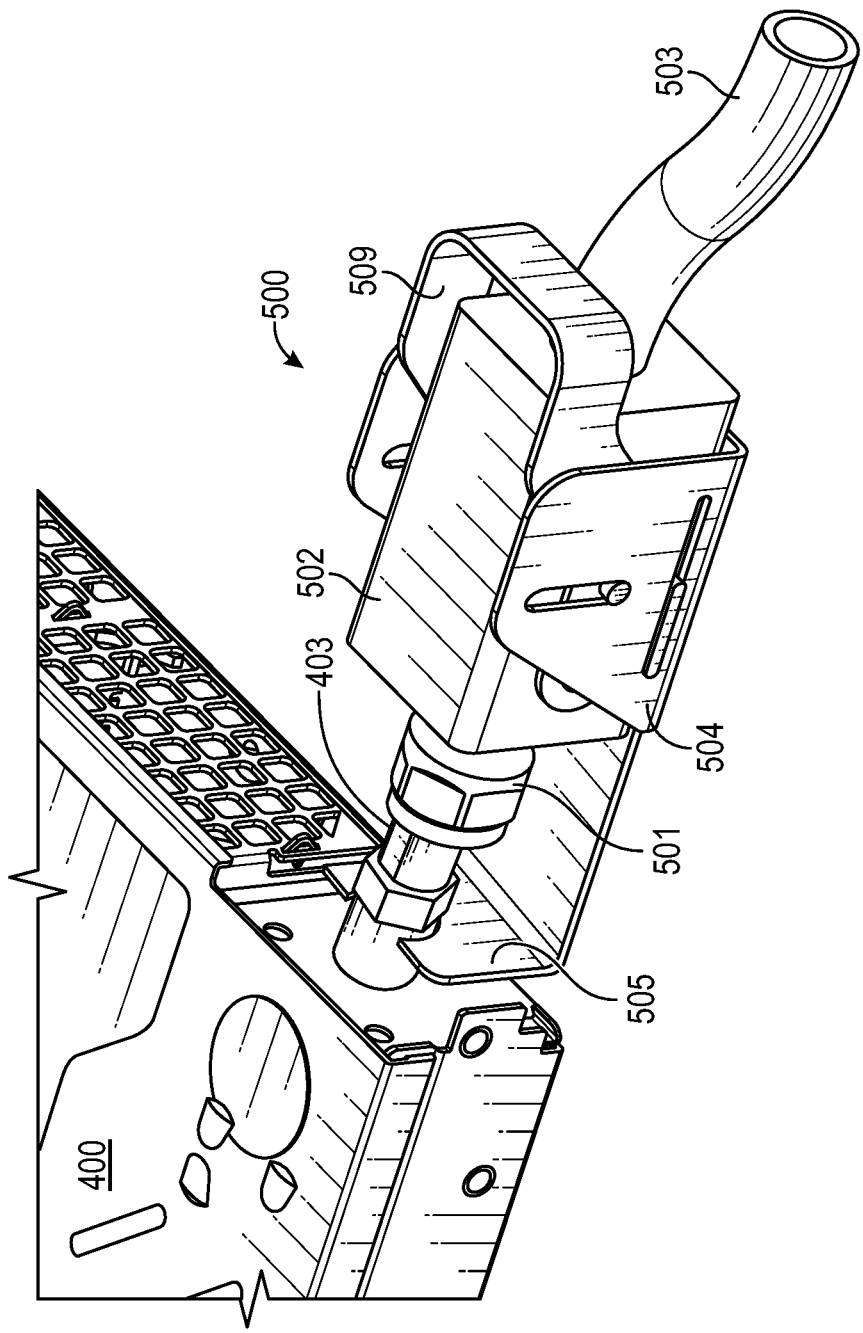

FIGS. 7A and 7B illustrate operation of the bench clip when attached to a server chassis and the liquid cooling fittings are unconnected or connected.

Figure 8:
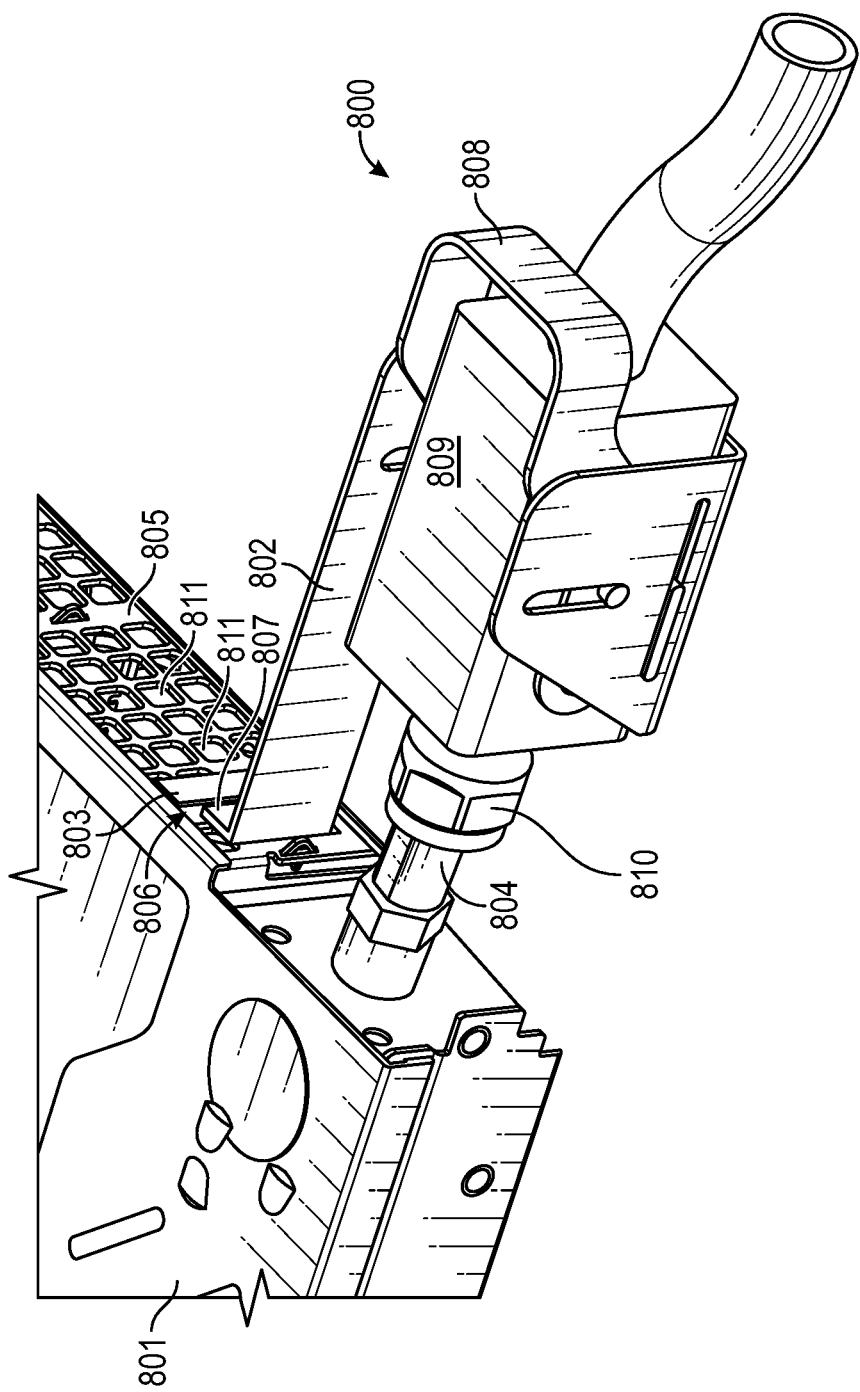

FIG. 8 illustrates an alternative bench clip that is attached to a server chassis using a modified retention bracket.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Open Rack v3 (ORV3) server designs that require liquid cooling rely on the liquid cooling infrastructure that is built-in to the ORV3 rack. These systems use specially-design, floating, blind mate liquid cooling fittings that do not have any inherent latching. In a rack environment, the rack and server liquid cooling fittings are held closed by latching the server to the rack itself. In a bench environment, where servers are built, modified, and debugged, the servers are not latched into place and, therefore, the liquid cooling fittings are not held closed, which will prevent the servers from operating.

The embodiments disclosed herein provide an apparatus that uses a rack manifold's liquid fitting and incorporates a hand-operated latching mechanism around the fitting or server chassis features. This latching mechanism creates a bench top liquid fitting system for ORV3 servers. The latching mechanism holds the liquid fitting itself closed and provides a mechanical advantage to reduce the very high forces required for liquid fitting connections.

Existing liquid fittings used on servers have a spring-loaded collar for latching. Prior designs using blind mate liquid fittings were not available on full computing racks, but instead were used on 4U or 5U height enclosures that could be used in a bench environment. The newer ORV3 designs are the first time there has been a need to attach liquid fittings that cannot be latched and locked together naturally.

FIG. 1 is an illustration of a computing rack 100 that includes liquid cooling manifolds 101, 102 and busbar 103, according to embodiments. Computing rack 100 may conform to any appropriate standard or proprietary design and, in particular, may conform to ORV3. FIG. 1 is a rear-facing view of a partially assembled computing rack 100. In some instances, rack 100 includes a frame structure, that may include side panels with rails, brackets, guides, or other components for receiving hardware that is installed in one or more slots 104 of the rack 100. Such hardware may include, for example, a chassis housing one or more of a server, processing unit, memory/storage device, cooling unit, or the like combined to form an Information Handling System (IHS). The frame structure of rack 100 may include a base 105 and a top cover 106 that may be connected via any number of vertical panels, braces, posts, supports, etc.

In the rear-facing view of FIG. 1, the length of busbar 103 is visible as it extends the vertical height of the rack 100, from the base 105 to the top cover 106 in providing a shared supply of power for the hardware components that are installed in the rack 100. Also visible in FIG. 1 is the full length of the liquid cooling manifolds 101, 102 that also extend the vertical height of the rack 100. In the illustrated embodiment, each of the liquid cooling manifolds 101, 102 are attached to the rack 100 via brackets 107. Through the fastening of brackets 107, each of the liquid cooling manifolds 101, 102 is firmly fixed to rack 100. The couplings (not shown) of the liquid cooling manifolds 101, 102 are aligned with rack, and thus with liquid cooling couplings of a chassis or server when installed in a slot of the rack 100. Aligned in this manner, an administrator is able to insert a chassis into the rack 100 and apply force on the chassis until liquid cooling couplings of the chassis are connected with corresponding couplings of the liquid cooling manifolds 101, 102. Similarly, busbar 103 extends the height of computing rack 100 and provides power to each chassis, server, or other IHS component installed in slots on rack 100.

FIG. 2 is a front-view illustration of a server IHS 200 being inserted into a slot of computing rack 100. The server 200 may share resources provided by the rack 100, such as shared cooling and power. Accordingly, insertion of server IHS 200 into a slot of rack 100 couples the liquid cooling couplings 201, 202 on server IHS 200 to liquid cooling manifolds 101, 102, respectively. Power coupling 203 on server IHS 200 is coupled to busbar 103. In a data center environment, server IHS 200 may be installed within a rack 101 along with other similar chassis, such as other server IHSs, that are likewise installed in one or more slots where some or all of these chassis may be similarly coupled to liquid cooling manifolds 101, 102 and busbar 103 provided by the rack 101. Rack 101 includes multiple slots in which a server IHS 200 or similar chassis can be physically inserted by an administrator, where the server IHS 200 is inserted by force applied by an administrator in the direction 204 illustrated in FIG. 2. The sever IHS 200 may be securely locked in place the rack 100 by closing latches 205, which engage with the front edge of rack 100.

When installing server IHS 200 within rack 100, the force applied in direction 204 by the administrator couples the server 200 to shared infrastructure resources of the rack 100. For instance, the server IHS 200 is securely coupled to a busbar 103, which provides the server 200 with a supply of power. The busbar 103 provides a shared power supply used by some or all of the hardware installed in rack 100. Busbar 103 is partially enclosed within shielding 206, which prevents administrators or other users from touching the back or sides of busbar 103 to reduce risk of electrical shock.

In addition, the force applied by the administrator in direction 204 couples the server IHS 200 to liquid cooling manifolds 101, 102 provided by the rack 100. An inlet coolant manifold distributes cooled liquid from a recirculation system (not shown) to server IHS 200, and an outlet coolant manifold receives heated liquid from server IHS 200, which is returned to the recirculation system to be cooled. In the illustrated embodiments, the liquid cooling manifolds 101, 102 may be arranged with either of the manifolds functioning as the inlet manifold and the other as the outlet manifold, with this arrangement selected to correspond to arrangement of liquid cooling couplings 201, 202 of the server IHS 200 and of the other server IHSs or other hardware using the shared liquid cooling resources supported by rack 100. The use of liquid cooling manifolds 101, 102 enables the cooling of multiple servers and/or other hardware by a single cooling source (e.g., the liquid recirculation system).

Through the force applied by the administrator in direction 204, liquid cooling couplings 201, 202 of the server IHS 200 are connected to corresponding couplings 207, 208 of each of the liquid cooling manifolds 101, 102. Once coupled, the liquid cooling couplings 201, 202 are connected to internal inlet and outlet liquid coolant lines in the server IHS 200. In some embodiments, the liquid cooling couplings 201, 202 of the server IHS 200 and the couplings 207, 208 of the liquid cooling manifolds 101, 102 may be quick-connect couplings that can be connected without use of tools and solely via the force applied by the administrator in direction 204. Through the use of such quick-connect couplings, the coupling of server IHS 200 to the liquid cooling manifolds 101, 102 may thus be completed blindly by the administrator that is inserting the server into a slot in the rack 100, while unable to view the liquid cooling couplings 201, 202 that are being connected.

In many instances, racks 100 are constructed according to standardized dimensions that define the vertical and horizontal dimensions of hardware components, such as one or more server IHSs 200, that can be installed within such racks. Standardized rack dimensions specify vertical units of space within a rack, where such vertical units of rack space may be referred to as RUs (Rack Units). In some instances, a server IHS 200 may be one rack unit (1RU) in height and may house a single IHS. In other instances, an individual sever IHS installed in a rack 100 may be multiple rack units in height and may include multiple IHSs. The chassis may conform to an integer number of rack units, such as 1 OU or RU, 2 OU or RU, or the like. The chassis 200 may be any appropriate size configured to fit within the rack 100. For example, a 2RU chassis may include a pair of front-facing bays that are each 1RU in height. In such a chassis, each of the bays may receive a 1RU IHS that may be separately administered and may be a replaceable component that may be coupled and de-coupled from a chassis. In such instance, the 2RU chassis may be coupled to liquid cooling manifolds 101, 102 of rack 100 and may provide cooling for the 1RU IHSs that are installed in the chassis.

Server IHS 200 and other hardware may be installed within one or more slots that are supported by the rack 100, where use of multiple slots may correspond to the server being multiple RUs in height. Through insertion in slots supported by the rack 100, server IHS 200 may be reliably located relative to the rack itself, at least with respect to vertical and horizontal positioning of the server relative to the rack. Such positioning of the server IHS 200 may be supported by various guides and/or other structures that are located along the sides 209 of the outer enclosure of the server. These guides along the sides 209 of the server are received by corresponding rails or other precisely positioned structures along the inner walls of the rack 100.

FIG. 3 is a top view of a server IHS 200 making power and cooling connections while being installed in a rack 100. Cooling manifolds 101, 102 extend vertically along the backside of rack 100. Liquid cooling couplings 201, 202 on server IHS 200 are configured to connect to cooling manifolds 101, 102 via female connectors 207, 208. Although not shown in FIG. 3, it is understood that each of the cooling manifolds 101, 102 may include a set of female connectors 207, 208 for any given rack unit along the height of the rack 100. Furthermore, the particular connectors 201, 202, 207. 208 are for example only, and the scope of implementations may be adapted to use any appropriate liquid cooling connector. In various implementations, the manifold cooling connectors 207, 208 and the server IHS cooling connectors 201, 202 may be either male or female.

Busbar 103 also extends vertically along the backside of rack 100. Busbar 103 is divided horizontally into two electrically isolated halves 103a, 103b that are assigned respective positive and negative, or high-low voltage, polarities for electrical power provided to server IHS 200. Computing racks complying with ORV3 use a DC busbar for power delivery. The typical busbar voltage is 48-54 Vdc and the busbar current can be as high as 3000 A to support 140 KW racks. Power coupling 203 has two sides 203a, 203b corresponding to the polarity of busbar 103. A protrusion or ridge 301 runs vertically along busbar 103 and is configured to fit snuggly between prongs 203a, 203b of power coupling 203 to ensure a tight electrical connection.

The current-carrying capacity of busbar 130 is determined by the maximum temperature at which the bar is permitted to operate, which is typically defined as a maximum temperature rise in standards such as ANSI C37.20 for switchgear assemblies including metal-enclosed bus. As the operating temperature increases, the rate of surface oxidation of the conductor material increases rapidly, which limits the lifetime of the busbar. Accordingly, if the busbar can be cooled, then the busbar will be able to carry more current or safety margins for the busbar can be increased. Cooling busbar 103 will increase the thermal safety margin for rack 100, increase the current-carrying capacity of busbar 103, increase contact reliability with server IHS 200, and will decrease power loss. Convection cooling can be used to transfer heat away from busbar 103. Air cooling of busbar 103 is difficult in environments such as computing rack 100 where server IHS 200 are liquid cooled. Such computing racks require minimal air cooling so that the available airflow through the rack 100 is reduced compared to air-cooled racks. Additionally, protective shielding 206 blocks or reduces airflow near busbar 103 even if the shielding 206 is formed from a perforated or screen material. Liquid cooling of busbars is difficult to achieve due to manufacturing issues and the insulation requirements to prevent energizing the liquid cooling.

In an example embodiment, compressed air may be used to add active cooling to busbar 103. Busbar 103 may comprise a common, off-the-shelf, hollow busbar, which are available in many shapes. Existing hollow busbars are configured with ambient air in the hollow portion. In busbar 103, facility compressed air is connected through an expansion valve or vortex tube. On expansion, the compressed air becomes very cold. The cold, fast-moving air is injected into one end of the busbar 103 cavity, which actively cools the busbar. Waste heat is transferred to the airflow and exhausted out the other end of the busbar 103 cavity.

Server IHS 200 and similar ORV3 designs that require liquid cooling rely heavily on the liquid cooling infrastructure built-in to computing rack 100. These systems use blind-mate liquid cooling couplings and manifolds that do not have any inherent latching. When mounted in rack 100, the liquid cooling fittings 201, 202 on server IHS 200 are held connected to corresponding couplings 207, 208 of the liquid cooling manifolds 101, 102 by latching the server IHS 200 to rack 100, such as by closing latches 205. In a bench or development environment, where server IHSs 200 are built, modified, and debugged, the liquid cooling fittings 201, 202 are not attached to a cooling manifold by locking the server in a rack. Instead, coolant lines are attached directly to liquid cooling fittings 201, 202. Because the blind-mate fittings on a server IHS 200 are designed to slidingly engage the manifold couplings on a rack, the server IHS liquid cooling fittings 201, 202 are not designed to attach to bench coolant lines using screw, latched, or universal quick disconnect type connections. The server IHS cannot operate without liquid cooling in a bench environment. Accordingly, a connection between the server IHS and bench coolant lines that does not impact rack-mounted use is required.

FIG. 4 is a partial top view from the rear of a server chassis 400 that is adapted to fit in a computing rack, such as an ORV3-compatable rack. Server chassis 400 is designed to slide into a slot on the computing rack in direction 401. Server chassis 400 has a pair of male liquid coolant fittings 402 that are adapted to mate with corresponding female liquid coolant couplings in the computing rack. The liquid coolant fittings 402 have a fastener portion 403 that is configured to assist in attachment of the liquid coolant fitting to server chassis 400, such as by providing a hex nut shape for engagement by a wrench or other tool. In other embodiments, the fastener portion 403 may have another shape such as a square nut or a knurled region. The liquid coolant fittings 402 connect with liquid coolant couplings in the computing rack. The server chassis 400 also has a busbar clip 404 for connecting to the busbar in the computing rack.

FIG. 5 illustrates a liquid cooling bench clip 500 according to an example embodiment. Bench clip 500 is adapted to provide a connection to either an inlet or outlet liquid coolant fitting 402 on a sever chassis 400, which allows for operation of the server chassis with sufficient system cooling when not installed in a computing rack, such as in a developer bench environment. The bench clip 500 comprises a liquid coolant fitting 501 attached to a manifold 502. Manifold 502 is a single-fitting manifold that is adapted to support one fitting 501 instead of an array of liquid coolant fittings such as manifolds 101, 102. A flexible liquid cooling line 503 couples a port on the manifold 502 to a bench environment liquid coolant heat exchanger system (not shown). When bench clip 500 is attached to an input cooling fitting on a server chassis, liquid cooling line 503 is used to supply cold liquid from the heat exchanger system to manifold 502 and then to fitting 501. When bench clip 500 is attached to an output cooling fitting on a server chassis, liquid cooling line 503 is used to return warmed liquid received from fitting 501 via manifold 502 to the heat exchanger system. Liquid coolant fitting 501 has the same profile as the female liquid coolant couplings in an ORV3 computing rack. This allows liquid coolant fitting 501 to attach to a liquid coolant fitting 402 on a sever chassis so that cooling fluid can cycle between heat exchanger system and the server chassis during bench operation.

In a rack-mount configuration, insertion forces of 25 to 40 pounds may be required when installing a server chassis in a computing rack to ensure that the liquid coolant fittings mate securely. Due to hydraulic pressure in the liquid coolant system, similar forces may be required to hold the server chassis liquid coolant fittings against the rack manifold coolant fittings during operation. A rack-installed server chassis is held in place against coolant manifold using latches. That configuration is not available when a sever chassis is operating independently in the bench environment. Bench clip 500 includes a retention bracket 504 to hold bench clip liquid coolant fitting 501 against a server chassis liquid coolant fitting 402 outside the rack environment. Retention bracket 504 has a claw portion 505 that is adapted to fit behind a fastener portion 403 on a server chassis 400.

Manifold portion 502 is slidingly coupled to retention bracket 504 using tabs 506 that fit within horizontal slots 507 on both sides of the device. Bench clip liquid cooling fitting 501 is capable to moving forward and aft along axis 508 by corresponding sliding movement of manifold tabs 506 within slots 507. A bench clip handle 509 is pivotably attached manifold 502 using a hole 510 in handle 509 surrounding post 511 on manifold 502. Bench clip handle 509 is also slidingly coupled to retention bracket 504 using posts 512 that fit within vertical slots 513 on both sides of the device.

Bench clip handle 509 is used to move manifold portion 502 forward and aft along axis 508. Rotation of handle 509 along path 514 causes handle 509 to pivot around post 511. The movement of handle 509 relative to retention bracket 504 is constrained by posts 512 moving within vertical slots 513. Similarly, movement of manifold 502 relative to retention bracket 504 is constrained by tabs 506 moving within horizontal slots 507, which limits manifold 502 to forward/backward lateral movement along axis 508.

FIGS. 6A and 6B illustrate operation of the bench clip 500 when the handle 509 is moved between the vertical position (FIG. 6A) and the horizontal position (FIG. 6B) by a user. FIG. 6A corresponds to an unconnected state for the bench clip 500 when handle 509 is raised 514A to a substantially vertical position. As the handle top end 509a pivots upward and forward around post 511 on manifold 502, post 512 moves upward in slot 513. This has the effect of forcing the handle bottom end 509b to move backward in direction 515A. Since the handle 509 is attached to manifold post 511, the backward movement of handle bottom end 509b forces manifold 502 to also move backward. As manifold 502 moves backward, the attached fitting 501 moves in the same direction. The width of tab 506 in slot 507 prevents manifold 502 from tilting during movement, which keeps fitting 501 aligned along axis 508. With handle 509 in the full vertical position, fitting 501 is moved a maximum distance 516 away from the claw portion 505.

FIG. 6B corresponds to a connected state for the bench clip 500 when handle 509 is lowered 514B to a substantially horizontal position. As the handle top end 509a pivots downward and aft around post 511 on manifold 502, post 512 moves downward in slot 513. This has the effect of forcing the handle bottom end 509b to move forward in direction 515B. Since the handle 509 is attached to manifold post 511, the forward movement of handle bottom end 509b forces manifold 502 to also move forward. As manifold 502 moves forward, the attached fitting 501 moves in the same direction. With handle 509 in the full horizontal position, fitting 501 is moved to a minimum distance 517 away from the claw portion 505.

FIGS. 7A and 7B illustrate operation of the bench clip 500 when attached to a server chassis 400 and the liquid cooling fittings are unconnected (FIG. 7A) or connected (FIG. 7B). FIGS. 7A and 7B show bench clip 500 hooked on to server chassis 400 by positioning claw portion 505 behind a fastener portion 403. The shape of claw portion 505 is adapted to fit between fastener portion 403 and the back side of server chassis 400. Variations in the design of fastener portion, such as the fastener's distance from the back, side, or bottom of server chassis 400 and/or the diameter or length of the fastener, can be compensated for by modifying length of the retention bracket 504 and the shape of claw portion 505.

In FIG. 7A, bench clip handle 509 is in the vertical or unconnected position. Bench clip fitting 501 is moved the maximum distance backward to allow claw portion 505 to be positioned behind fastener portion 403. Bench clip fitting 501 is aligned with server chassis fitting 402 with separation between the fittings.

In FIG. 7B, the bench clip handle 509 is moved down to the horizontal or connected position. Bench clip fitting 501 and manifold 502 are moved forward, which couples bench clip fitting 501 to server chassis fitting 402. Claw portion 505 is pulled against the fastener portion 403, which allows the rotational force of handle 509 to be transferred to an insertion force for bench clip fitting 501 as it connects to server chassis fitting 402. If claw portion 505 was not hooked on to fastener portion 403, then the entire bench clip 500 would be pushed backward when the fittings attempted to connect.

Although example bench clip 500 requires retention bracket 504 and claw portion 505 to hook or grab on to the fastener portion 403, it will be understood that other configurations may be used to attach the bench clip to the server chassis without requiring interaction with a fastener portion.

FIG. 8 illustrates an alternative bench clip 800 that is attached to a server chassis 801 using a modified retention bracket 802. Instead of extending from the bottom of the bench clip to grab on to a fastener portion, retention bracket 802 extends along the side of the bench clip 800 and interlocks with a support structure 803 attached to the back side of server chassis 801 at location spaced away from coolant fitting 804. Support structure 803 may be an existing element of server chassis 801 such as a post used to reinforce or mount ventilation screen 805 or to attach a surface of the server chassis. Support structure 803 may be attached to the top and bottom surfaces of server chassis 801 and offset from ventilation screen 805 to create a slot or space 806 between support structure 803 and screen 805. A tab 807 on the end of retention bracket 802 is adapted to slip within slot 806.

Bench clip 800 operates in a similar manner as bench clip 500 wherein movement of handle 808 will force manifold 809 and liquid cooling fitting 810 to move forward and backward. With handle 808 initial in a vertical position (not shown), tab 807 can be inserted within slot 806 to align fitting 810 with fastener portion 803. The handle 808 can then be rotated to the down position shown in FIG. 8 to force fitting 810 into fastener portion 803 and to establish a connection with a liquid cooling fitting on server chassis 801. Tab 807 is pulled against the support structure 803, which allows the rotational force of handle 808 to be transferred to an insertion force for bench clip fitting 810 as it connects to the server chassis fitting 801. If tab 806 was not engaged with support structure 803, then the entire bench clip 800 would be pushed backward when the fittings attempted to connect.

It will be understood that other configurations of the retention bracket may be used to attach the bench clip to a server chassis. For example, the retention bracket may be modified to hook onto holes 811 in ventilation screen 805 to provide a connection that resists the liquid cooling fitting insertion force. Other variations of the retention bracket may be adapted to connect to other holes, slots, protrusions, or detents on one or more surfaces of server chassis 801.

In an example configuration, a clip for a liquid cooling system comprises a manifold that is attached to a liquid coolant fitting. The liquid coolant fitting is adapted to engage a liquid coolant fitting on a server chassis so that cooling fluid can pass to or from a liquid coolant line. The manifold has a port for the liquid coolant line, which can be an ingress cold-liquid line or an egress warm-liquid line. The liquid coolant may be water or some nonconductive fluid that is circulated within the server chassis to remove heat from components such as processors. The clip has a retention bracket with at least two slots. A first slot on the retention bracket is adapted to receive a tab on the manifold. A second slot on the retention bracket is oriented perpendicular to the first slot. A clip handle is pivotably mounted to a post on the manifold. The handle has a post that is positioned within the second slot on the retention bracket. The manifold tab is configured to slide within the first slot, and the handle post is configured to slide within the second slot. This movement may be achieved in response to movement of the handle. The retention bracket has an attachment end. The attachment end is configured to engage with a portion of the server chassis, such as a hook or claw shape.

In one arrangement, the first slot is oriented horizontally and the second slot is oriented vertically. The range of movement of the manifold tab within the first slot thereby limits movement of the manifold itself to a single axis relative to the clip. The movement of the handle post downward in the second slot causes the manifold tab to move in a forward direction in the first slot. The movement of the handle post upward in the second slot causes the manifold tab to move in a backward direction in the first slot. A pair of the first slots may be located on opposite sides of the manifold, and a pair of the second slots may be located on opposite sides of the manifold.

Rotation of the handle to a horizontal position forces the liquid coolant fitting toward the attachment end of the retention bracket. Rotation of the handle to a vertical position forces the liquid coolant fitting away from the attachment end of the retention bracket.

In some configurations, the attachment end of the retention bracket is configured to engage the liquid coolant fitting on the server chassis or to engage a fastener portion of a liquid coolant fitting on the server chassis. The fastener portion may be a nut, bolt, screw, slot, bracket, or other component that is used to install, mount, or attached the liquid coolant fitting to the server chassis.

In other configurations, the attachment end of the retention bracket is configured to engage a slot, hole, detent, protrusion or other feature on the server chassis. Such features may be separate from and unrelated to the liquid coolant fittings, such as a cover, panel, vent, support structure, post, or fastener.

When the attachment end of the retention clip is engaged with a feature of the server chassis or with the liquid coolant fitting on the server chassis, the clip is held in position relative to the server chassis by opposing the forces that are generated by the coolant fitting connections or by liquid coolant hydraulic forces.

In another arrangement, a clip for attaching a liquid cooling system to a server chassis comprises a single-fitting manifold attached to a liquid coolant fitting. The single-fitting manifold is configured to support one liquid coolant fitting. The liquid coolant fitting is adapted to connect to a fitting on the server chassis. A retention bracket on the clip has a pair of horizontal slots that are adapted to receive tabs located on opposite sides of the manifold. A U-shaped handle on the clip has two ends. Each end of the U-shaped handle is pivotably attached to posts located on opposite sides of the manifold. A pair of posts are located on the opposite sides of the U-shaped handle. The posts are positioned within vertical slots on the retention bracket. A claw portion of the retention bracket, the claw portion configured to engage with a feature of the server chassis. The claw portion and the retention bracket may be a single component.

A liquid coolant line is attached to the single-fitting manifold. The liquid coolant line is adapted to exchange cooling fluid between the manifold and a heat exchanger system.

The manifold tabs are configured to slide within the pair of horizontal slots on the retention clip. The handle posts are configured to slide within the second slots on the retention clip. The sliding movement is in response to movement of the handle. The shape of the manifold tabs within the pair of horizontal slots may limit movement of the manifold to a horizontal axis.

The claw portion of the retention bracket is configured to connect to the server chassis in a manner that resists forces tending to push the retention bracket away from the server chassis.

When the claw portion engages with the feature of the server chassis, the clip remains in position relative to the server chassis in response to forces generated by coolant fitting connections or by liquid coolant hydraulic forces.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

What is claimed is:
1. A clip for a liquid cooling system, comprising:
a manifold attached to a liquid coolant fitting and having a port for a liquid coolant line;
a retention bracket having a first slot that is adapted to receive a tab on the manifold and having a second slot oriented perpendicular to the first slot;

a handle pivotably mounted to a post on the manifold, the handle having a post positioned within the second slot on the retention bracket; and an attachment end on the retention bracket, the attachment end configured to engage with a portion of a server chassis.

2. The clip of claim 1, wherein the manifold tab is configured to slide within the first slot and the handle post is configured to slide within the second slot in response to movement of the handle.

3. The clip of claim 1, wherein the liquid coolant fitting attached to the manifold is adapted to engage a liquid coolant fitting on the server chassis so that cooling fluid can pass to or from the liquid coolant line.

4. The clip of claim 1, wherein the first slot is oriented horizontally and the second slot is oriented vertically.

5. The clip of claim 1, wherein movement of the manifold tab within the first slot limits movement of the manifold to a single axis relative to the clip.

6. The clip of claim 1, wherein movement of the handle post downward in the second slot causes the manifold tab to move in a forward direction in the first slot.

7. The clip of claim 6, wherein movement of the handle post upward in the second slot causes the manifold tab to move in a backward direction in the first slot.

8. The clip of claim 1, wherein rotation of the handle to a horizontal position forces the liquid coolant fitting toward the attachment end of the retention bracket.

9. The clip of claim 1, wherein rotation of the handle to a vertical position forces the liquid coolant fitting away from the attachment end of the retention bracket.

10. The clip of claim 1, wherein the attachment end of the retention bracket is configured to engage a liquid coolant fitting or a fastener portion of a liquid coolant fitting on the server chassis.

11. The clip of claim 1, wherein the attachment end of the retention bracket is configured to engage a slot, hole, detent, or protrusion on the server chassis.

12. The clip of claim 1, wherein, when the attachment end is engaged with the portion of the server chassis, the clip remains in position relative to the server chassis in response to forces generated by coolant fitting connections or by liquid coolant hydraulic forces.

13. The clip of claim 1, further comprising a pair of the first slots located on opposite sides of the manifold and a pair of the second slots located on opposite sides of the manifold.

14. A clip for attaching a liquid cooling system to a server chassis, comprising:

a single-fitting manifold attached to a liquid coolant fitting, the liquid coolant fitting adapted to connect to a fitting on the server chassis;

a retention bracket having a pair of horizontal slots adapted to receive tabs located on opposite sides of the manifold;

a U-shaped handle having two ends, each end of the U-shaped handle pivotably attached to posts located on opposite sides of the manifold;

a pair of posts located on the opposite sides of the U-shaped handle, the handle posts positioned within vertical slots on the retention bracket; and a claw portion of the retention bracket, the claw portion configured to engage with a feature of the server chassis.

15. The clip of claim 14, further comprising:

a liquid coolant line attached to the single-fitting manifold, the liquid coolant line adapted to exchange cooling fluid between the manifold and a heat exchanger system.

16. The clip of claim 14, wherein the manifold tabs are configured to slide within the horizontal slots and the handle posts are configured to slide within the vertical slots in response to movement of the handle.

17. The clip of claim 14, wherein a shape of the manifold tabs within the pair of horizontal slots limits movement of the manifold to a horizontal axis.

18. The clip of claim 14, wherein the claw portion and the retention bracket are a single component.

19. The clip of claim 14, wherein the claw portion of the retention bracket is configured to connect to the server chassis in a manner that resists forces tending to push the retention bracket away from the server chassis.

20. The clip of claim 14, wherein, when the claw portion is engaged with the feature of the server chassis, the clip remains in position relative to the server chassis in response to forces generated by coolant fitting connections or by liquid coolant hydraulic forces.

* * * * *